(12) United States Patent
Sekiya (10) Patent No.: US 8,104,665 B2
(45) Date of Patent: Jan. 31, 2012

(54) MANUFACTURING METHOD FOR COMPOSITE SUBSTRATE

(75) Inventor: Kazuma Sekiya, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/968,787

(22) Filed: Dec. 15, 2010

(65) Prior Publication Data

US 2011/0155791 A1 Jun. 30, 2011

(30) Foreign Application Priority Data

Dec. 24, 2009 (JP) ................ 2009-292329

(51) Int. Cl.
*B23K 31/02* (2006.01)
*B23D 39/00* (2006.01)

(52) U.S. Cl. ................ 228/162; 228/172

(58) Field of Classification Search ............ 228/162, 228/172
See application file for complete search history.

(56) References Cited

U.S. PATENT DOCUMENTS

| 6,677,173 | B2* | 1/2004 | Ota ................... | 438/22 |
| 7,033,858 | B2* | 4/2006 | Chai et al. ............ | 438/106 |
| 7,825,009 | B2* | 11/2010 | Sekiya ................ | 438/463 |
| 7,829,909 | B2* | 11/2010 | Yoo ................... | 257/99 |
| 8,016,643 | B2* | 9/2011 | Sekiya ................ | 451/41 |
| 8,025,553 | B2* | 9/2011 | Sekiya et al. .......... | 451/5 |
| 2006/0289892 | A1* | 12/2006 | Lee et al. .............. | 257/103 |
| 2009/0315069 | A1* | 12/2009 | Lee et al. .............. | 257/103 |

FOREIGN PATENT DOCUMENTS

| JP | 60-092686 | 5/1985 |
| JP | 05-166923 | 7/1993 |

* cited by examiner

*Primary Examiner* — Kiley Stoner
*Assistant Examiner* — Carlos Gamino
(74) *Attorney, Agent, or Firm* — Greer, Burns & Crain, Ltd.

(57) ABSTRACT

A composite substrate manufacturing method including the steps of grinding a sapphire substrate to uniform the thickness of the sapphire substrate, next forming an optical device layer on the front side of the sapphire substrate, next bonding the front side of a heat sink substrate through a bonding metal layer to the front side of the optical device layer formed on the front side of the sapphire substrate to thereby form a composite substrate, next grinding the back side of the heat sink substrate of the composite substrate to uniform the thickness of the composite substrate, and finally grinding the back side of the sapphire substrate of the composite substrate to reduce the thickness of the sapphire substrate to a predetermined thickness.

1 Claim, 8 Drawing Sheets

MANUFACTURING METHOD FOR COMPOSITE SUBSTRATE

BACKGROUND OF THE INVENTION

1. Field of the Invention

The present invention relates to a manufacturing method for a composite substrate having an optical device wafer composed of a sapphire substrate and an optical device layer (epitaxial layer) formed on the front side of the sapphire substrate and a heat sink substrate bonded to the front side of the optical device layer in the optical device wafer.

2. Description of the Related Art

In an optical device fabrication process, an optical device layer of gallium nitride compound semiconductors is formed on the front side of a substantially disk-shaped sapphire substrate to form an optical device wafer, wherein the optical device layer is partitioned by a plurality of crossing streets to form a plurality of regions where optical devices such as light emitting diodes (LEDs) and laser diodes (LDs) are respectively formed. The optical device wafer is cut along the streets to divide the regions where the optical devices are formed from each other, thereby obtaining the individual optical devices (see Japanese Patent No. 2859478, for example). A heat sink member is bonded to an optical device for the purpose of heat radiation (see Japanese Patent Laid-open No. Sho 60-92686, for example).

SUMMARY OF THE INVENTION

Each optical device has a size of 0.3 mm square, for example. Accordingly, it is troublesome to individually bond a plurality of heat sinks respectively to such small-sized optical devices, causing a reduction in productivity. A plurality of optical devices each having a heat sink bonded thereto may be efficiently produced by a method including the steps of preparing an optical device wafer composed of a sapphire substrate and an optical device layer formed on the front side of the sapphire substrate, bonding a heat sink substrate to the front side of the optical device layer of the optical device wafer, grinding the sapphire substrate to reduce the thickness of the sapphire substrate to a predetermined thickness, and cutting the optical device wafer together with the heat sink substrate. However, the following problem arises.

An optical device layer is formed on the front side of a sapphire substrate, and a heat sink substrate is bonded through a bonding metal layer to the front side of the optical device layer, thus forming a composite substrate. However, unless the thicknesses of all the sapphire substrate, the bonding metal layer, and the heat sink substrate are uniform, the thickness of the sapphire substrate constituting the composite substrate cannot be uniformed by grinding the back side of the sapphire substrate in the condition where the heat sink substrate of the composite substrate is held on a chuck table of a grinding apparatus. As a result, when the thickness of the sapphire substrate is reduced to about 10 μm by grinding, a part of the optical device layer may be exposed to cause a degradation in quality of any optical device. Furthermore, there is a possibility that the quality of each optical device cannot be stabilized.

It is therefore an object of the present invention to provide a manufacturing method for a composite substrate having an optical device wafer and a heat sink substrate bonded to the front side of the optical device wafer, wherein the sapphire substrate of the composite substrate can be ground to obtain a uniform thickness.

In accordance with an aspect of the present invention, there is provided a manufacturing method for a composite substrate having an optical device wafer composed of a sapphire substrate and an optical device layer formed on the front side of the sapphire substrate and a heat sink substrate bonded to the front side of the optical device layer in the optical device wafer, the manufacturing method including: a sapphire substrate thickness uniforming step of grinding the sapphire substrate to uniform the thickness of the sapphire substrate; an optical device layer forming step of forming the optical device layer on the front side of the sapphire substrate after performing the sapphire substrate thickness uniforming step; a composite substrate forming step of bonding the front side of the heat sink substrate through a bonding metal layer to the front side of the optical device layer formed on the front side of the sapphire substrate, thereby forming the composite substrate; a composite substrate thickness uniforming step of grinding the back side of the heat sink substrate in the condition where the sapphire substrate of the composite substrate is held on a chuck table of a grinding apparatus, thereby uniforming the thickness of the composite substrate; and a finish grinding step of grinding the back side of the sapphire substrate in the condition where the heat sink substrate of the composite substrate is held on a chuck table of a grinding apparatus after performing the composite substrate thickness uniforming step, thereby reducing the thickness of the sapphire substrate to a predetermined thickness.

In the composite substrate manufacturing method according to the present invention, the thickness of the sapphire substrate is first uniformed by performing the sapphire substrate thickness uniforming step. Thereafter, the optical device layer is formed on the front side of the sapphire substrate uniformed in thickness. Thereafter, the front side of the heat sink substrate is bonded to the front side of the optical device layer formed on the front side of the sapphire substrate, thereby forming the composite substrate. Thereafter, the back side of the heat sink substrate constituting the composite substrate is ground as following the uniform thickness of the sapphire substrate, thereby uniforming the thickness of the composite substrate. Finally, the back side of the sapphire substrate is ground in the condition where the heat sink substrate of the composite substrate is held on the chuck table of the grinding apparatus, thereby reducing the thickness of the sapphire substrate to a predetermined thickness in the finish grinding step. Accordingly, the thickness of the sapphire substrate is finally uniformed, so that although the thickness of the sapphire substrate is reduced to about 5 μm, the optical device layer is not exposed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
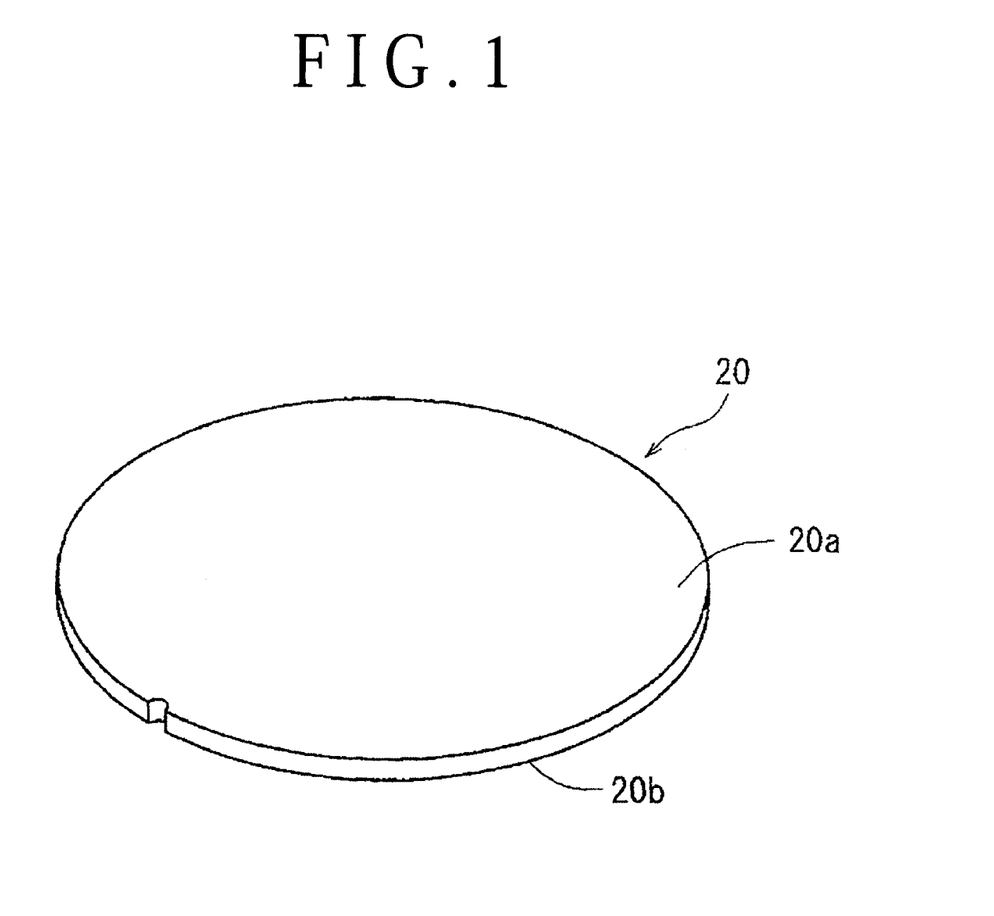
FIG. 1 is a perspective view of a sapphire substrate constituting a composite substrate to be manufactured by a composite substrate manufacturing method according to a preferred embodiment of the present invention.

A preferred embodiment of the composite substrate manufacturing method according to the present invention will now be described in detail with reference to the attached drawings. FIG. 1 shows a circular sapphire substrate 20 for forming an optical device wafer constituting a composite substrate. The sapphire substrate 20 has a thickness of 480 µm, for example.

The sapphire substrate 20 has a front side 20a and a back side 20b. The sapphire substrate 20 is first subjected to a sapphire substrate thickness uniforming step of grinding the front side 20a in the condition where the back side 20b is held on a chuck table of a grinding apparatus, thereby uniforming the thickness of the sapphire substrate 20. More specifically, the sapphire substrate thickness uniforming step is performed by using a grinding apparatus 3 shown in FIG. 2A. The grinding apparatus 3 shown in FIG. 2A includes a chuck table 31 for holding a workpiece and grinding means 32 for grinding the workpiece held on the chuck table 31. The chuck table 31 has an upper surface for holding the workpiece under suction. The chuck table 31 is rotatable in the direction shown by an arrow 31a in FIG. 2A. The grinding means 32 includes a spindle housing 321, a spindle 322 rotatably supported to the spindle housing 321 so as to be rotated by a rotational drive mechanism (not shown), a mounter 323 mounted on the lower end of the spindle 322, and a grinding wheel 324 mounted on the lower surface of the mounter 323. The grinding wheel 324 is composed of an annular base 325 and a plurality of abrasive members 326 mounted on the lower surface of the base 325 so as to be annularly arranged along the outer circumference of the base 325. The base 325 is mounted to the lower surface of the mounter 323 by a plurality of fastening bolts 327.

Figure 2A:
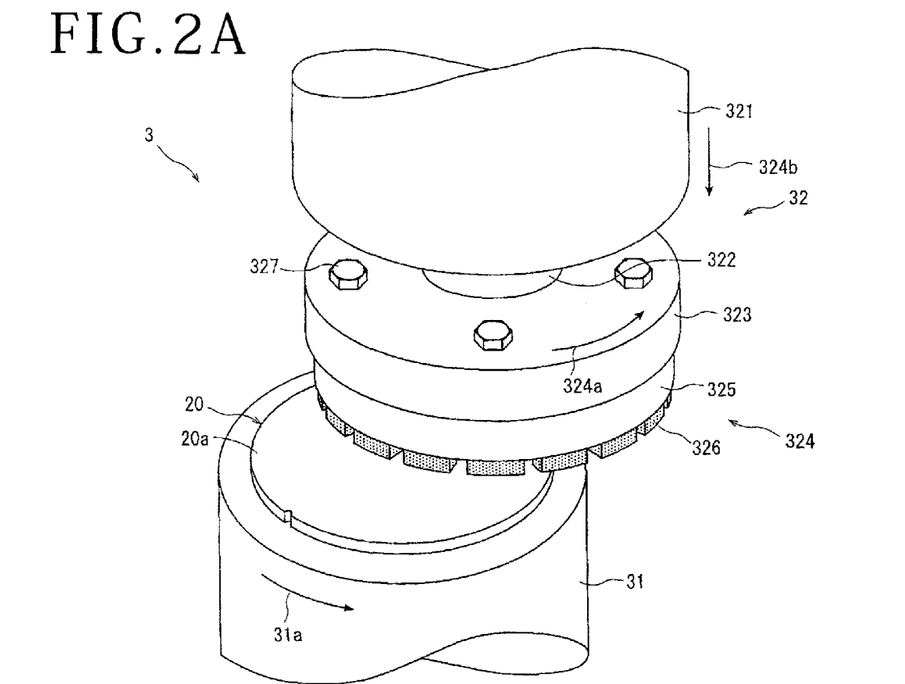
FIG. 2A is a perspective view showing a sapphire substrate thickness uniforming step of the composite substrate manufacturing method.
Figure 2B:
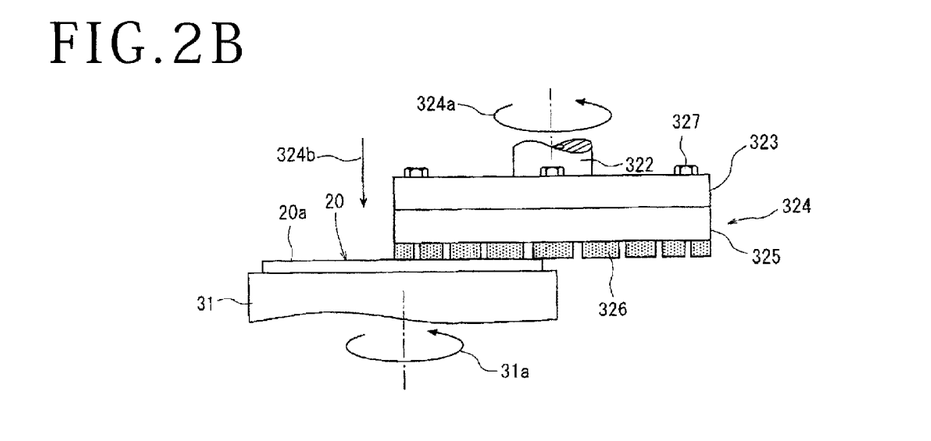
FIG. 2B is a side view corresponding to FIG. 2A.

A grinding step of grinding the front side 20a of the sapphire substrate 20 is performed by using the grinding apparatus 3 in the following manner. First, the back side 20b of the sapphire substrate 20 is placed on the upper surface (holding surface) of the chuck table 31 as shown in FIG. 2A. In this condition, suction means (not shown) is operated to hold the sapphire substrate 20 under suction on the chuck table 31 (sapphire substrate holding step). Accordingly, the front side 20a of the sapphire substrate 20 held on the chuck table 31 is oriented upward. In the condition where the sapphire substrate 20 is held under suction on the chuck table 31 as mentioned above, the chuck table 31 is rotated at 500 rpm, for example, in the direction shown by the arrow 31a in FIG. 2A and the grinding wheel 324 of the grinding means 32 is also rotated at 1000 rpm, for example, in the direction shown by an arrow 324a in FIG. 2A. Thereafter, the grinding wheel 324 is lowered to bring the abrasive members 326 into contact with the front side 20a of the sapphire substrate 20 as a work surface. Thereafter, the grinding wheel 324 is fed by 30 µm, for example, at a predetermined feed speed in a downward direction (perpendicular to the holding surface of the chuck table 31) as shown by an arrow 324b in FIGS. 2A and 2B. As a result, the front side 20a of the sapphire substrate 20 is ground by 30 µm to uniform the thickness of the sapphire substrate 20 to 450 µm in this preferred embodiment (sapphire substrate thickness uniforming step).

Figure 3A:
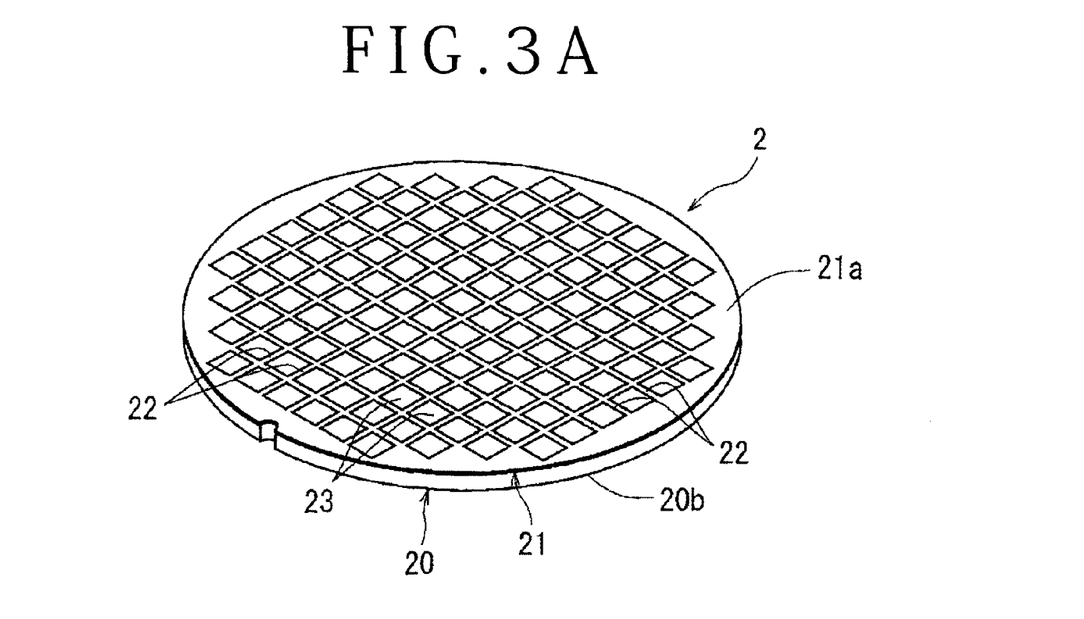
FIG. 3A is a perspective view of an optical device wafer obtained by an optical device layer forming step of the composite substrate manufacturing method.
Figure 3B:
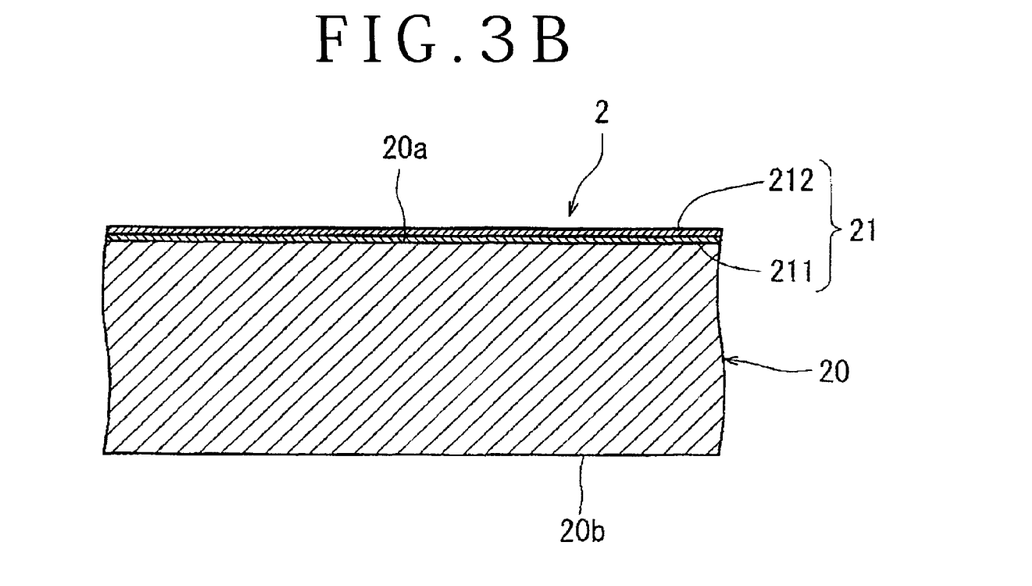
FIG. 3B is an enlarged sectional view of a part of the optical device wafer shown in FIG. 3A.

After performing the sapphire substrate thickness uniforming step mentioned above, an optical device layer forming step of forming an optical device layer on the front side 20a of the sapphire substrate 20 is performed in the following manner. As shown in FIGS. 3A and 3B, an n-type nitride semiconductor layer 211 is formed on the front side 20a of the sapphire substrate 20 by epitaxial growth, and a p-type nitride semiconductor layer 212 is formed on the front side of the n-type nitride semiconductor layer 211 by epitaxial growth, thereby forming an optical device layer (epitaxial layer) 21 having a thickness of 10 µm, for example. The optical device layer (epitaxial layer) 21 is partitioned into a plurality of rectangular regions by a plurality of crossing streets 22, wherein an optical device 23 such as a light emitting diode (LED) and a laser diode (LD) is formed in each rectangular region. Thus, the sapphire substrate 20 and the optical device layer 21 constitute an optical device wafer 2.

Figure 4A:
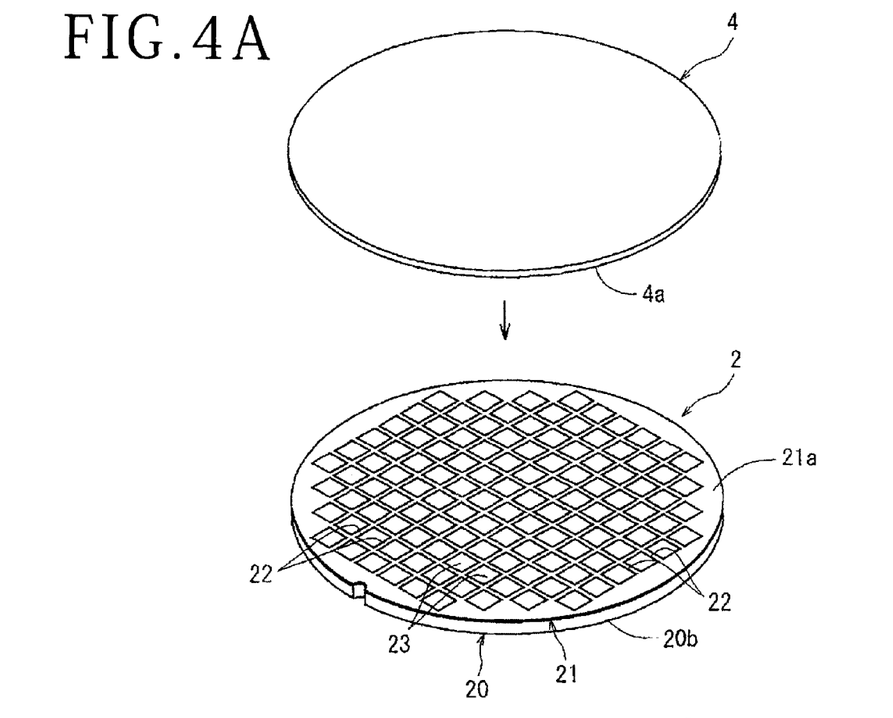
FIG. 4A is a perspective view showing a composite substrate forming step of the composite substrate manufacturing method.
Figure 4B:
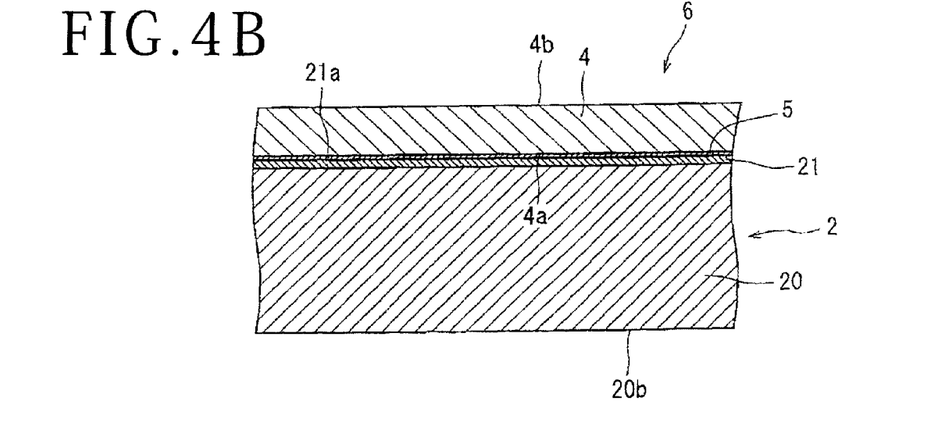
FIG. 4B is an enlarged sectional view of a part of a composite substrate obtained by the composite substrate forming step shown in FIG. 4A.

After performing the optical device layer forming step, a composite substrate forming step is performed in such a manner that the front side of a heat sink substrate is bonded through a bonding metal layer to the front side of the optical device layer 21 formed on the front side of the sapphire substrate 20, thereby forming a composite substrate. More specifically, as shown in FIGS. 4A and 4B, a heat sink substrate 4 having a thickness of 230 µm, for example, is prepared. The heat sink substrate 4 is formed of copper tungsten alloy (Cu—W), for example. The heat sink substrate 4 has a front side 4a and a back side 4b. The front side 4a of the heat sink substrate 4 is bonded through a bonding metal layer 5 to the front side 21a of the optical device layer 21 formed on the front side of the sapphire substrate 20 constituting the optical device wafer 2. More specifically, the bonding metal layer 5 is formed by evaporation of a bonding metal such as gold on the front side 21a of the optical device layer 21 formed on the front side of the sapphire substrate 20 or on the front side 4a of the heat sink substrate 4. Thereafter, the bonding metal layer 5 is brought into pressure contact with the front side 4a of the heat sink substrate 4 or the front side 21a of the optical device layer 21, thereby bonding the front side 4a of the heat sink substrate 4 through the bonding metal layer 5 to the front side 21a of the optical device layer 21 of the optical device wafer 2. As a result, a composite substrate 6 shown in FIG. 4B is obtained.

Figure 5A:
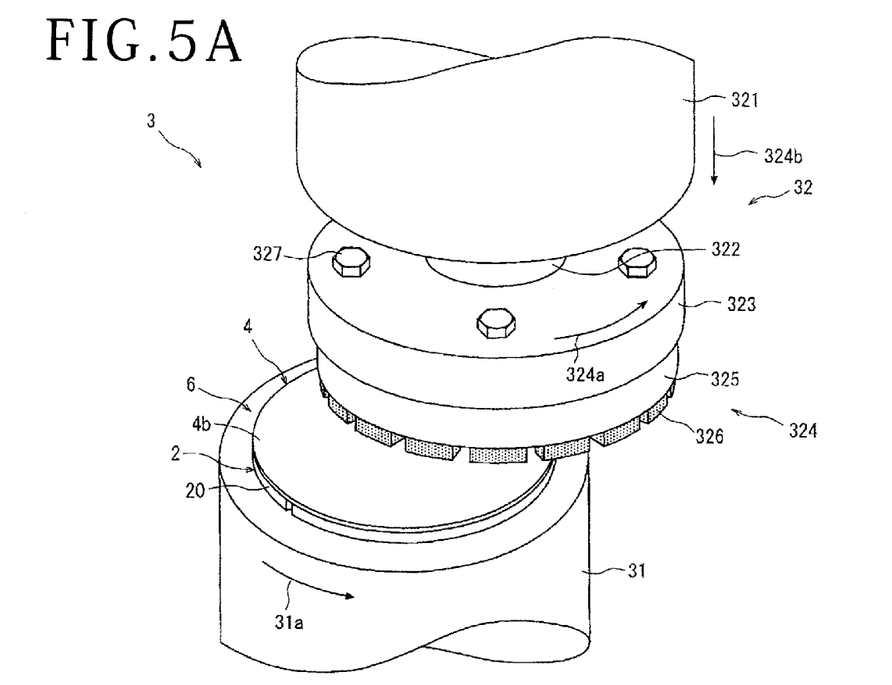
FIG. 5A is a perspective view showing a composite substrate thickness uniforming step of the composite substrate manufacturing method.

After performing the composite substrate forming step mentioned above, a composite substrate thickness uniforming step is performed in such a manner that the back side 4b of the heat sink substrate 4 is ground in the condition where the sapphire substrate 20 of the composite substrate 6 is held on a chuck table of a grinding apparatus, thereby uniforming the thickness of the composite substrate 6. This composite substrate thickness uniforming step may be performed by using the grinding apparatus 3 shown in FIG. 2A. The composite substrate thickness uniforming step using the grinding apparatus 3 is performed in the following manner. As shown in FIG. 5A, the sapphire substrate 20 of the composite substrate 6 is placed on the upper surface (holding surface) of the chuck table 31. In this condition, the suction means (not shown) is operated to hold the composite substrate 6 under suction on the chuck table 31 (composite substrate holding step). Accordingly, the back side 4b of the heat sink substrate 4 of the composite substrate 6 held on the chuck table 31 is oriented upward.

Figure 5B:
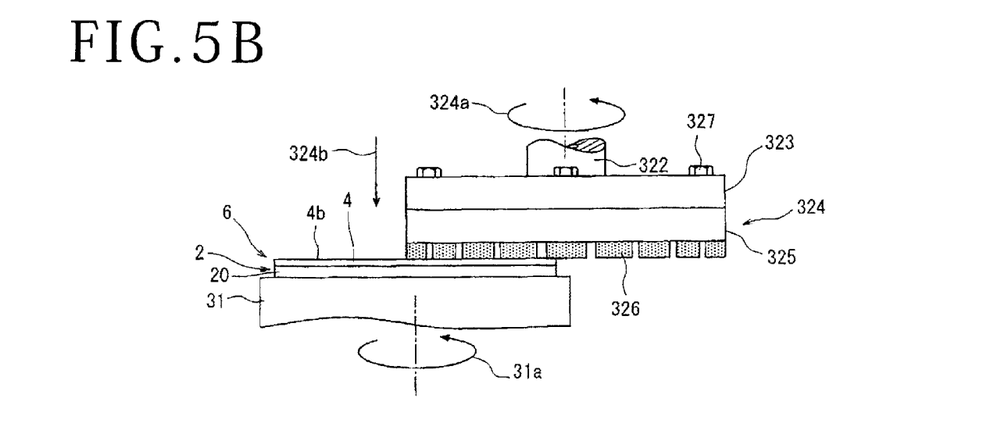
FIG. 5B is a side view corresponding to FIG. 5A.

In the condition where the composite substrate 6 is held under suction on the chuck table 31 as mentioned above, the chuck table 31 is rotated at 300 rpm, for example, in the direction shown by an arrow 31a in FIG. 5A and the grinding wheel 324 of the grinding means 32 is also rotated at 6000 rpm, for example, in the direction shown by an arrow 324a in FIG. 5A. Thereafter, the grinding wheel 324 is lowered to bring the abrasive members 326 into contact with the back side 4b of the heat sink substrate 4 as a work surface. Thereafter, the grinding wheel 324 is fed by 30 μm, for example, at a predetermined feed speed in a downward direction (perpendicular to the holding surface of the chuck table 31) as shown by an arrow 324b in FIGS. 5A and 5B. Accordingly, the back side 4b of the heat sink substrate 4 is ground by 30 μm to uniform the thickness of the heat sink substrate 4 to 200 μm in this preferred embodiment. As a result, the thickness of the composite substrate 6 is uniformed to 660 μm in this preferred embodiment (composite substrate thickness uniforming step).

Figure 6A:
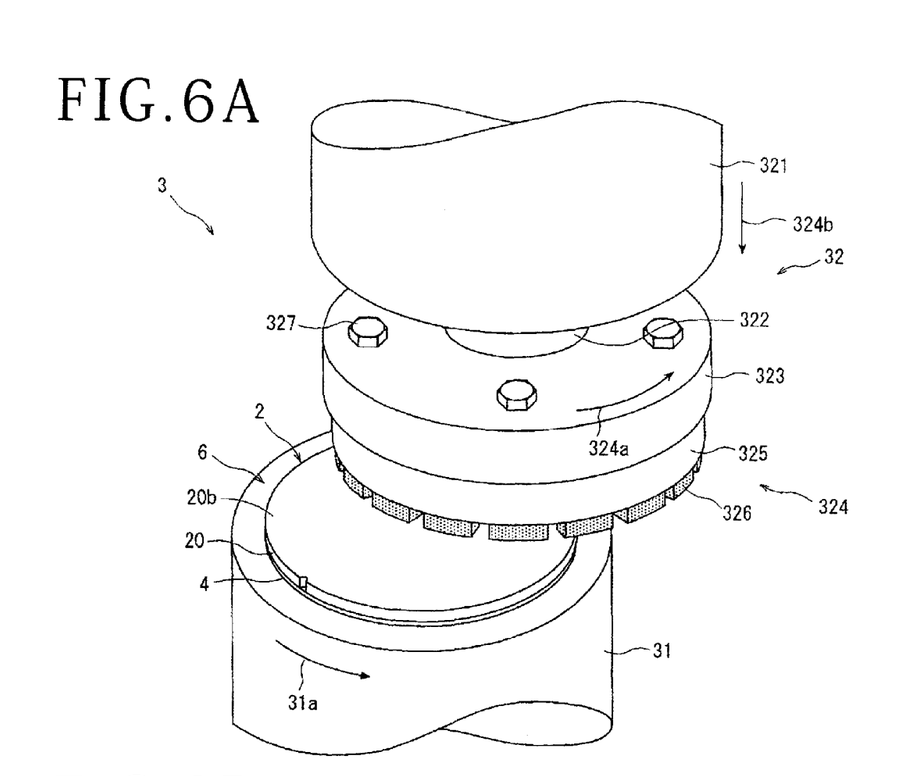
FIG. 6A is a perspective view showing a finish grinding step of the composite substrate manufacturing method.

After performing the composite substrate thickness uniforming step mentioned above, a finish grinding step is performed in such a manner that the back side 20b of the sapphire substrate 20 is ground in the condition where the heat sink substrate 4 of the composite substrate 6 is held on a chuck table of a grinding apparatus, thereby reducing the thickness of the sapphire substrate 20 to a predetermined thickness. This finish grinding step may be performed by using the grinding apparatus 3 shown in FIG. 2A. The finish grinding step using the grinding apparatus 3 is performed in the following manner. As shown in FIG. 6A, the heat sink substrate 4 of the composite substrate 6 is placed on the upper surface (holding surface) of the chuck table 31. In this condition, the suction means (not shown) is operated to hold the composite substrate 6 on the chuck table 31 (composite substrate holding step). Accordingly, the back side 20b of the sapphire substrate 20 of the composite substrate 6 held on the chuck table 31 is oriented upward.

Figure 6B:
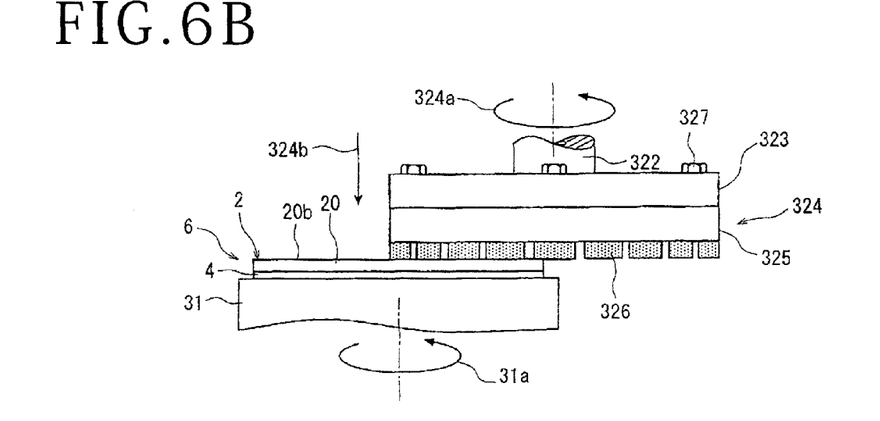
FIG. 6B is a side view corresponding to FIG. 6A.
Figure 7A:
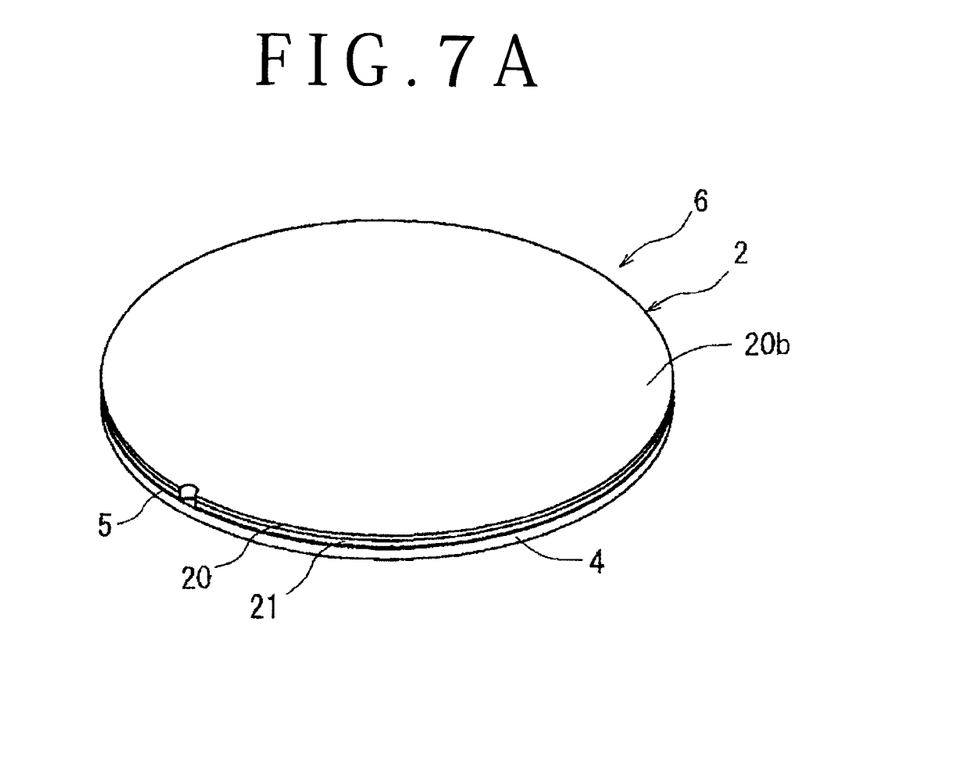
FIG. 7A is a perspective view of the composite substrate obtained by the finish grinding step shown in FIGS. 6A and 6B.
Figure 7B:
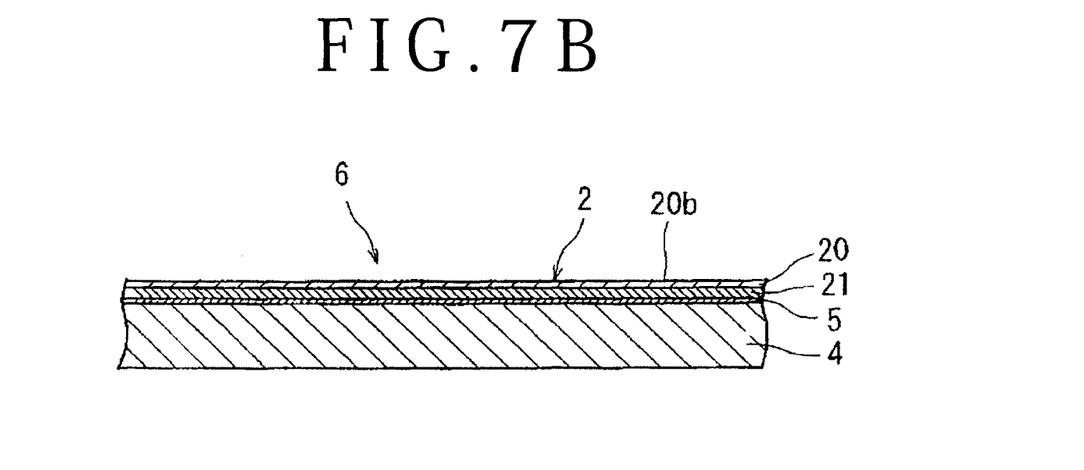
FIG. 7B is an enlarged sectional view of a part of the composite substrate shown in FIG. 7A.

In the condition where the composite substrate 6 is held under suction on the chuck table 31 as mentioned above, the chuck table 31 is rotated at 500 rpm, for example, in the direction shown by an arrow 31a in FIG. 6A and the grinding wheel 324 of the grinding means 32 is also rotated at 1000 rpm, for example, in the direction shown by an arrow 324a in FIG. 6A. Thereafter, the grinding wheel 324 is lowered to bring the abrasive members 326 into contact with the back side 20b of the sapphire substrate 20 as a work surface. Thereafter, the grinding wheel 324 is fed by 445 μm, for example, at a predetermined feed speed in a downward direction (perpendicular to the holding surface of the chuck table 31) as shown by an arrow 324b in FIGS. 6A and 6B. As a result, the back side 20b of the sapphire substrate 20 is ground by 445 μm to reduce the thickness of the sapphire substrate 20 to 5 μm in this preferred embodiment. Accordingly, the thickness of the optical device wafer 2 becomes 15 μm in this preferred embodiment. By performing the finish grinding step, the heat sink substrate 4 having a thickness of 200 μm is bonded through the bonding metal layer 5 to the front side of the optical device wafer 2 having a thickness of 15 μm to obtain the composite substrate 6 as a final product as shown in FIGS. 7A and 7B.

In the composite substrate manufacturing method according to the present invention as described above, the thickness of the sapphire substrate 20 is first uniformed by performing the sapphire substrate thickness uniforming step. Thereafter, the optical device layer 21 is formed on the front side of the sapphire substrate 20 uniformed in thickness. Thereafter, the front side of the heat sink substrate 4 is bonded to the front side of the optical device layer 21 formed on the front side of the sapphire substrate 20, thereby forming the composite substrate 6. Thereafter, the back side of the heat sink substrate 4 constituting the composite substrate 6 is ground as following the uniform thickness of the sapphire substrate 20, thereby uniforming the thickness of the composite substrate 6. Finally, the back side of the sapphire substrate 20 is ground in the condition where the heat sink substrate 4 of the composite substrate 6 is held on the chuck table of the grinding apparatus, thereby reducing the thickness of the sapphire substrate 20 to a predetermined thickness in the finish grinding step. Accordingly, the thickness of the sapphire substrate 20 is finally uniformed, so that although the thickness of the sapphire substrate 20 is reduced to about 5 μm, the optical device layer 21 is not exposed.

Figure 8:
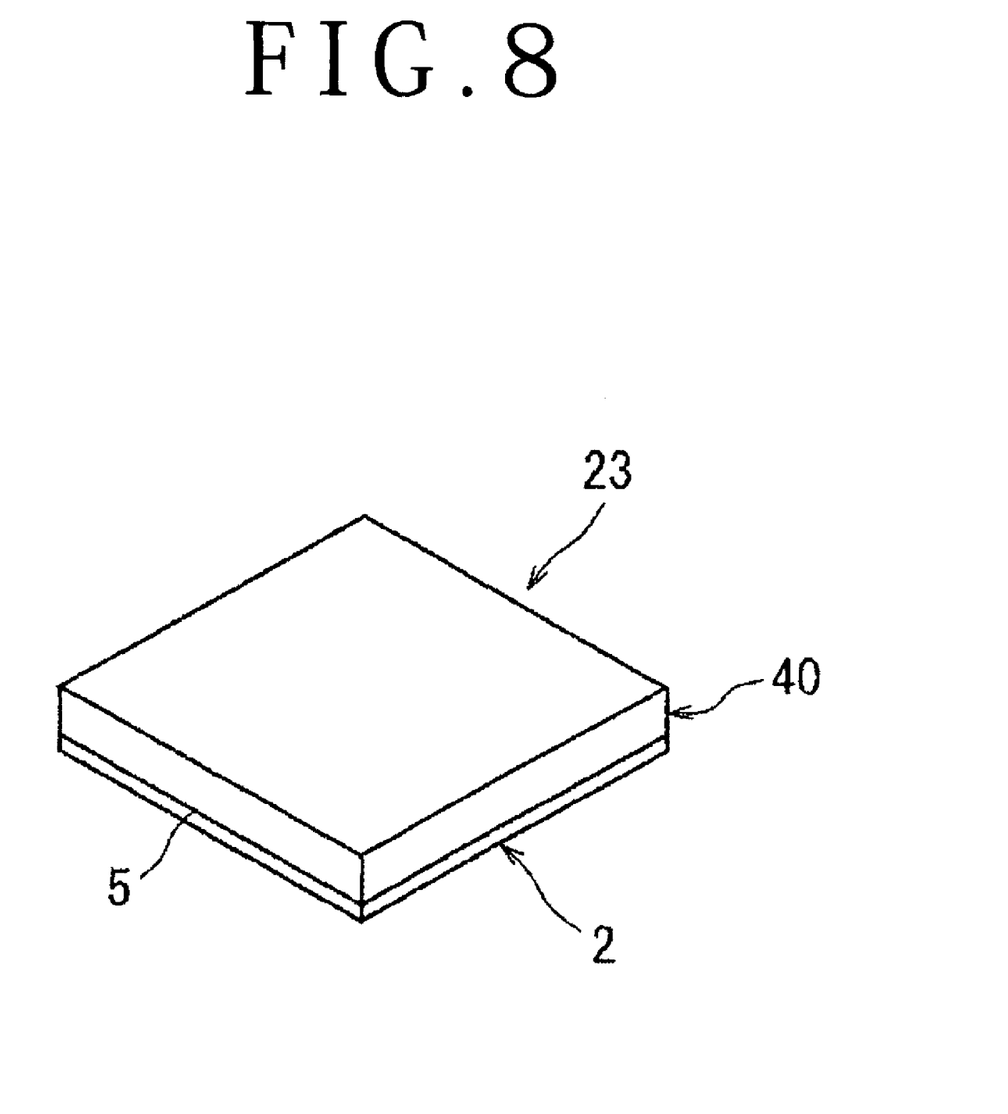
FIG. 8 is a perspective view of an optical device divided from the composite substrate shown in FIGS. 7A and 7B.

The composite substrate 6 thus manufactured by the present invention is next subjected to a dividing step of dividing the composite substrate 6 along the plural streets 22 formed on the front side of the optical device layer 21 of the optical device wafer 2. As a result, the composite substrate 6 shown in FIGS. 7A and 7B is divided into a plurality of individual optical devices. FIG. 8 shows such an optical device 23 having such a structure that a heat sink 40 is bonded through the bonding metal layer 5 to the front side of the optical device 23.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method for a composite substrate having an optical device wafer composed of a sapphire substrate and an optical device layer formed on the front side of said sapphire substrate and a heat sink substrate bonded to the front side of said optical device layer in said optical device wafer, said manufacturing method comprising:

a sapphire substrate thickness uniforming step of grinding said sapphire substrate to uniform the thickness of said sapphire substrate;

an optical device layer forming step of forming said optical device layer on the front side of said sapphire substrate after performing said sapphire substrate thickness uniforming step;

a composite substrate forming step of bonding the front side of said heat sink substrate through a bonding metal layer to the front side of said optical device layer formed on the front side of said sapphire substrate, thereby forming said composite substrate;

a composite substrate thickness uniforming step of grinding the back side of said heat sink substrate in the condition where said sapphire substrate of said composite substrate is held on a chuck table of a grinding apparatus, thereby uniforming the thickness of said composite substrate; and a finish grinding step of grinding the back side of said sapphire substrate in the condition where said heat sink substrate of said composite substrate is held on a chuck table of a grinding apparatus after performing said composite substrate thickness uniforming step, thereby reducing the thickness of said sapphire substrate to a predetermined thickness.

* * * * *